(12) United States Patent
Shin et al.

(10) Patent No.: US 9,193,133 B2
(45) Date of Patent: Nov. 24, 2015

(54) GRAPHENE-LAYERED STRUCTURE, METHOD OF PREPARING THE SAME, AND TRANSPARENT ELECTRODE AND TRANSISTOR INCLUDING GRAPHENE-LAYERED STRUCTURE

(71) Applicant: SAMSUNG ELECTRONICS CO., LTD., Suwon-si, Gyeonggi-do (KR)

(72) Inventors: Hyeon-jin Shin, Suwon-si (KR); Jae-young Choi, Suwon-si (KR); Joung-real Ahn, Suwon-si (KR); Jung-tak Seo, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/165,819

(22) Filed: Jan. 28, 2014

(65) Prior Publication Data

US 2014/0141265 A1    May 22, 2014

Related U.S. Application Data

(62) Division of application No. 13/530,656, filed on Jun. 22, 2012, now Pat. No. 8,679,951.

(30) Foreign Application Priority Data

Jun. 24, 2011   (KR) ........................ 10-2011-0061796

(51) Int. Cl.
  *H01L 21/265*   (2006.01)
  *B32B 9/04*   (2006.01)
  (Continued)

(52) U.S. Cl.
  CPC . *B32B 9/04* (2013.01); *B82Y 10/00* (2013.01); *B82Y 30/00* (2013.01); *B82Y 40/00* (2013.01); *H01L 21/02378* (2013.01); *H01L 21/02488* (2013.01); *H01L 21/02527* (2013.01); *H01L 21/02656* (2013.01); *H01L 29/1606* (2013.01); *H01L 29/1608* (2013.01); *H01L 29/778* (2013.01); *H01L 31/022466* (2013.01); *H01L 31/1884* (2013.01); *H01M 4/96* (2013.01);
  (Continued)

(58) Field of Classification Search
  USPC ......... 257/9, E21.09; 438/149, 151, 197, 478
  See application file for complete search history.

(56) References Cited

U.S. PATENT DOCUMENTS 5,589,407 A * 12/1996 Meyyappan et al. ......... 438/766
5,999,719 A * 12/1999 Asada et al. .................... 703/12
(Continued)

FOREIGN PATENT DOCUMENTS

KR    1020100107403 A   10/2010

OTHER PUBLICATIONS

Gaddam et al., "Direct graphene growth on MgO: origin of the band gap", J. Phys.: Condens. Matter, vol. 23, 2011, pp. 072204.
(Continued)

*Primary Examiner* — Cheung Lee
*Assistant Examiner* — Stephen Bradley
(74) *Attorney, Agent, or Firm* — Cantor Colburn LLP

(57) ABSTRACT

A method of directly growing graphene of a graphene-layered structure, the method including ion-implanting at least one ion of a nitrogen ion and an oxygen ion on a surface of a silicon carbide (SiC) thin film to form an ion implantation layer in the SiC thin film; and heat treating the SiC thin film with the ion implantation layer formed therein to graphenize a SiC surface layer existing on the ion implantation layer.

6 Claims, 11 Drawing Sheets

(51) Int. Cl.
*H01L 21/02* (2006.01)
*H01L 31/0224* (2006.01)
*H01L 31/18* (2006.01)
*H01L 29/16* (2006.01)
*B82Y 30/00* (2011.01)
*B82Y 40/00* (2011.01)
*B82Y 10/00* (2011.01)
*H01L 29/778* (2006.01)
*H01M 8/08* (2006.01)
*H01M 8/10* (2006.01)
*H01M 4/96* (2006.01)
*H01M 8/02* (2006.01)

(52) U.S. Cl.
CPC ............ *H01M8/0234* (2013.01); *H01M 8/086* (2013.01); *H01M 8/1002* (2013.01); *H01M 8/103* (2013.01); *H01M 8/1011* (2013.01); *H01M 8/1041* (2013.01); *Y02E 10/50* (2013.01)

(56) References Cited

U.S. PATENT DOCUMENTS

| | | | |
|---|---|---|---|
| 7,476,594 B2 * | 1/2009 | Suvorov | ............... 438/407 |
| 7,772,059 B2 | 8/2010 | Parikh et al. | |
| 8,080,441 B2 | 12/2011 | Suvorov | |
| 8,252,264 B2 * | 8/2012 | Riehl et al. | ............... 423/447.1 |
| 2006/0226482 A1 | 10/2006 | Suvorov | |
| 2010/0065988 A1 | 3/2010 | Hannon et al. | |
| 2010/0323164 A1 * | 12/2010 | Ogihara et al. | ............... 428/156 |
| 2011/0064370 A1 | 3/2011 | Abraham et al. | |

OTHER PUBLICATIONS

Ueno, K et at., Enhanced Oxidation of Ion-Implanted Si-Face of 6H-SiC, Jpn. J. Appl. Phys. vol. 33, 1994, pp. 1121-1123 Part 2, No. 8A, Aug. 1, 1994.

Xiamen Powerway Advanced Material Co., Ltd., Silicon Carbide Wafer Spec (Originally published Jul. 20, 2010).

Kim et al., "Surface property change of graphene using nitrogen ion", J. Phys.: Condens. Matter, 22, 2010, pp. 1-4.

* cited by examiner

GRAPHENE-LAYERED STRUCTURE, METHOD OF PREPARING THE SAME, AND TRANSPARENT ELECTRODE AND TRANSISTOR INCLUDING GRAPHENE-LAYERED STRUCTURE

CROSS-REFERENCE TO RELATED APPLICATIONS

This application is a divisional application of U.S. application Ser. No. 13/530,656 filed Jun. 22, 2012, which claims priority to Korean Patent Application No. 10-2011-0061796, filed on Jun. 24, 2011, and all the benefits accruing therefrom under 35 U.S.C. §119, the disclosure of which is incorporated herein in its entirety by reference.

BACKGROUND

1. Field

Provided are graphene-layered structures, methods of preparing the same, and transparent electrodes and transistors including the graphene-layered structures. The methods of preparing the graphene-layered structures do not require a transferring process, and thus graphene may be directly grown on a substrate to be subsequently used. Therefore, defects in the graphene are minimized.

2. Description of the Related Art

In general, graphite is an allotropic form of the element carbon having a structure in which two-dimensional ("2D") graphene sheets are stacked.

The graphene has high transparency and conductivity, and thus is widely used in electrodes for various electric devices such as display devices and solar cells.

Such graphene is formed by providing a carbon source to a metal catalyst and then heat treating the resultant, and the obtained graphene is purified and transferred onto a predetermined substrate, thereby completing the manufacture of electric devices.

However, unexpected defects in the graphene, which are caused by the transferring process, such as tearing or wrinkles, may occur, and thus may adversely affect the physical properties of manufactured electric devices.

SUMMARY

Provided are methods of directly growing graphene on a target substrate.

Additional aspects will be set forth in part in the description which follows and, in part, will be apparent from the description, or may be learned by practice of the presented embodiments.

According to an aspect of the present invention, a method of preparing a graphene-layered structure includes ion-implanting at least one ion of a nitrogen ion and an oxygen ion on a surface of a silicon carbide (SiC) thin film to form an ion implantation layer in the SiC thin film; and heat treating the SiC thin film with the ion implantation layer formed therein to graphenize a SiC surface layer existing on the ion implantation layer.

The ion implantation layer may be a silicon nitride layer.

The SiC surface layer on the ion implantation layer may have a thickness of about 230 nanometers (nm) or less, for example, a thickness of about 100 nm or less.

The heat treating may be performed at a temperature in the range of about 1,000 degrees Celsius (° C.) to about 2,000° C. for about 0.001 hour to about 10 hours.

The graphene-layered structure may have a thickness of about one layer to about three hundred layers.

The graphene-layered structure may be an epitaxial structure.

The SiC thin film may have a thickness in the range of about 100 micrometers (μm) to about 500 μm.

The ion may be implanted into a Si-face of the SiC thin film.

The SiC thin film may include at least one selected from the group consisting of 4H—SiC, 6H—SiC and 3C—SiC.

The SiC thin film may be doped with at least one selected from the group consisting of aluminum, boron, nitrogen, phosphorus and a transition metal.

An implantation amount of the ion may be in the range of about $1\times10^{15}$ ions per square centimeter (ions/cm$^2$) to about $1\times10^{20}$ ions/cm$^2$, for example, in the range of about $1\times10^{16}$ ions/cm$^2$ to about $4\times10^{18}$ ions/cm$^2$.

A temperature of the SiC thin film is maintained in the range of about 300° C. to about 1,000° C. during the ion-implanting.

The heat treating may be performed using a heat source including induction heat, radiation heat, a laser, infrared ("IR") heat, microwaves, plasma, ultraviolet ("UV") rays and surface plasmon heat.

In the ion-implanting process, ions may be implanted using a mask in a patterned form.

According to another aspect of the present invention, a graphene-layered structure includes graphene; a silicon nitride layer existing below the graphene; and a silicon carbide layer existing below the silicon nitride layer.

According to another aspect of the present invention, a transistor includes the graphene-layered structure.

According to another aspect of the present invention, a transparent electrode includes the graphene-layered structure.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
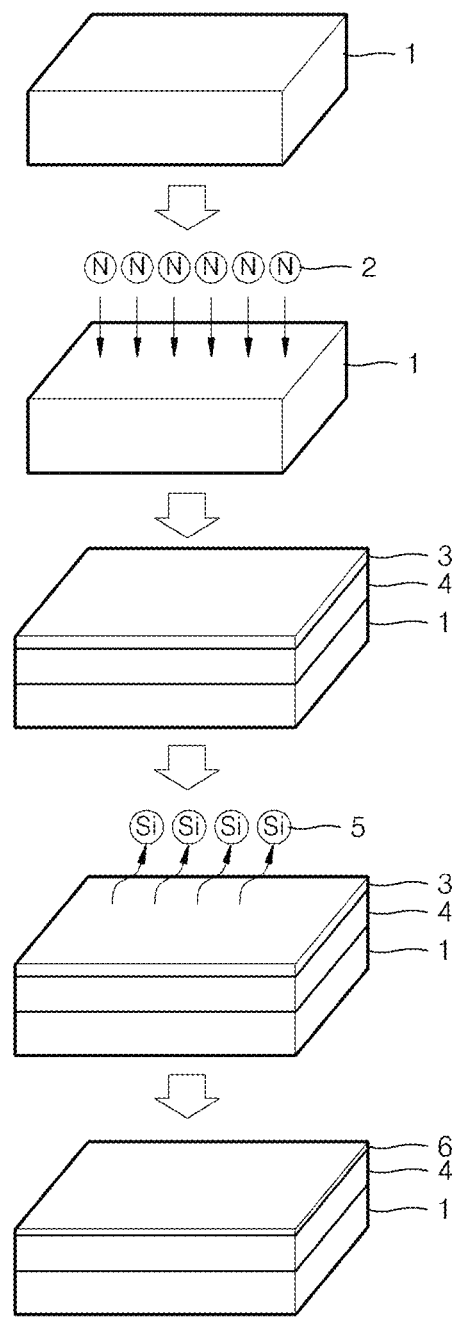
FIG. 1 is a diagram illustrating a method of directly growing graphene, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "above" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

According to an embodiment of the present invention, there is provided a method of directly growing graphene on a silicon carbide (SiC) thin film. When graphene is directly grown on a substrate, a transferring process is not required. Accordingly, processes of applying graphene to electric devices are simplified and defects in the graphene, which may be caused by the transferring process, may be reduced or effectively prevented.

In an embodiment, at least one of a nitrogen ion and an oxygen ion (gas ions) may be implanted into a surface of the SiC thin film to form an ion implantation layer in the SiC thin film. Subsequently, the SiC thin film with the ion implantation layer formed therein is heat treated to graphenize a SiC surface layer existing on the ion implantation layer. As a result, a graphene-layered structure having a sequential structure of SiC thin film/silicon nitride (SiN) layer/graphene may be obtained.

FIG. 1 is a diagram illustrating a method of preparing a graphene-layered structure according to an embodiment. Referring to FIG. 1, nitrogen gas ions 2 are implanted into an initial SiC thin film 1 by using an ion implantation method to form a SiN layer (e.g., ion implantation layer) 4 having a predetermined thickness. The SiN layer 4 is formed to a predetermined depth from the surface of the initial SiC thin film 1 into which the nitrogen gas ions 2 are implanted, and a SiC surface layer 3 exists thereon. When the resulting SiC thin film 1 with the SiN layer 4 formed therein is heat treated at a predetermined temperature, silicon ions 5 are released from the SiC surface layer 3 existing on the ion implantation layer 4, and the remaining carbon ions combine with each other to form graphene 6.

The graphene-layered structure including the graphene 6 directly on the SiN layer 4 and the SiN layer 4 directly on the SiC thin film 1 is formed by ion implanting on a surface of the initial SiC thin film 1 and heat treating the SiC thin film 1 having the SiN layer 4 thereon. The graphene 6 directly on the SiN layer 4 and the SiN layer 4 directly on the SiC thin film 1 of a final graphene-layered structure is considered a structural characteristic of the final graphene-layered structure. Since the direct relationship of the graphene 6, the SiN layer 4 and the SiC thin film 1 is imparted by the ion implanting and the heat treating described above, such process of ion implanting and heating treating is considered to impart the distinct structural characteristic of the graphene 6 directly on the SiN layer 4 and the SiN layer 4 directly on the SiC thin film 1.

The SiC thin film 1 used in the preparation method is a crystalline structure including the elements carbon and silicon, and can be any polytype of SiC, including the 3C—SiC, 4H—SiC, and 6H—SiC polytypes. In this regard, any one of the three types may be used in the preparation method described above. In addition, the SiC thin film 1 may be doped with a dopant to form a p- or n-type doped-SiC thin film. The dopant may be at least one selected from the group consisting of aluminum, boron, phosphorus and a transition metal. In one embodiment, for example, the transition metal may be chromium (Cr), manganese (Mn), or iron (Fe).

The surface of the SiC thin film 1 may be Si-face or C-face, and the Si-face surface of the SiC thin film 1 may be used as the surface into which ions are implanted, in terms of easy uniform adjustment of the number of layers.

The size and type of the SiC thin film 1 are not particularly limited. In one embodiment, for example, a circular wafer having a diameter from about 2 inches to about 4 inches may be used, or the SiC thin film 1 may have the form of a tetragon or a polygon. The thickness of the SiC thin film 1 may be in the range of about 0.5 millimeter (mm) to about 1 mm, or in the range of about 100 micrometers (μm) to about 500 μm. However, the thickness thereof is not limited to the above example.

As described above, at least one type of a nitrogen gas ion and an oxygen gas ion is implanted into the initial SiC thin film 1 by ion implantation to form an ion implantation layer 4 in the SiC thin film 1. The ion implantation is a process whereby a certain material is ionized, and the ionized material is then implanted into a solid in a high electric field, and is used to form the ion implantation layer 4 in the SiC thin film 1.

In the ion implantation process, an implantation amount of a gas ion, for example, a nitrogen gas ion, may be in the range of about $1\times10^{15}$ ions per square centimeter (ions/cm$^2$) to about $1\times10^{20}$ ions/cm$^2$, for example, in the range of about $1\times10^{16}$ ions/cm$^2$ to about $4\times10^{18}$ ions/cm$^2$, and the energy of the nitrogen gas ion may be in the range of about 30 kiloelectron volts (keV) to about 500 keV. By adjusting the implantation amount and energy of the gas ion, the thickness and quality of the ion implantation layer 4 may be controlled.

In the ion implantation process, the SiC thin film 1 may be damaged. Thus, to prevent the damage of the SiC thin film 1, the SiC thin film 1 may be maintained at a predetermined temperature during the ion implantation process. In one embodiment, for example, the temperature may be in the range of about 300 degrees Celsius (° C.) to about 1,500° C., for example, in the range of about 300° C. to about 1,000° C.

When the gas ion is implanted into the SiC thin film 1, the ion implantation layer 4 is formed in the SiC thin film 1. In one embodiment, for example, when a nitrogen gas ion is used as the gas ion, an insulating layer, for example, a SiN layer may be formed.

The ion implantation layer 4 is formed to a predetermined depth from the surface of the SiC thin film 1 into which the gas ion is implanted. That is, the ion implantation layer 4 having a predetermined thickness is formed to a predetermined depth from the surface of the SiC thin film 1 into which the gas ion is implanted, with the SiC surface layer having a predetermined thickness on the ion implantation layer 4.

The ion implantation layer 4 may include an insulating material, such as silicon nitride or silicon carbon nitride. The thickness of the ion implantation layer 4 may vary depending on the implantation amount and energy of the gas ion. In one embodiment, for example, the thickness of the ion implantation layer may be in the range of about 50 nanometers (nm) to about 3,000 nm; however, the thickness thereof is not limited to the above example.

The thickness of the SiC surface layer may be about 230 nm or less, for example, about 100 nm or less, for example, in the range of about 1 nm to about 100 nm.

In the ion implantation process, a photoresist (photosensitive material) is doped on the surface into which the gas ion is implanted, in a predetermined pattern. Alternatively, the ion implantation process is selectively performed using a mask with a predetermined pattern, thereby forming the predetermined pattern on the ion implantation layer.

As described above, when the ion implantation layer 4 is formed in the SiC thin film 1 by gas ion implantation and then heat treated at a predetermined temperature for a certain period of time, carbon ions are released to the surface of the SiC surface layer 3 on the ion implantation layer 4 and combine with each other to form graphene.

The heat treatment process may be performed in a reducing atmosphere or in an inert atmosphere. For the reducing atmosphere, a hydrogen gas, an ammonia gas, or a mixture thereof may be used, or a mixture of at least one of these gases and at least one of a nitrogen gas and an argon gas may be used. When at least one of the hydrogen gas and the ammonia gas is mixed with at least one of the nitrogen gas and the argon gas, the amount of at least one of the hydrogen gas and the ammonia gas may be in the range of about 0.01 volume % to about 40 volume % with respect to the total volume of a container, and the pressure of the mixed total gases is maintained at 1 atmosphere (atm). For the inert atmosphere, at least one of a nitrogen gas and an argon gas may be used.

The heat treatment process plays a significant role in forming graphene, and may be performed at a temperature in the range of about 1,000° C. to about 2,000° C., for example, in the range of about 1,200° C. to about 1,800° C. for about 0.001 hour to about 1 hour. In addition, the heat treatment process may be performed at a pressure of from about $1\times10^{-12}$ torr (Torr) to about 760 Torr.

A heat source for the heat treatment process may be, but is not limited to, induction heat, radiation heat, a laser, infrared ("IR") heat, microwaves, plasma, ultraviolet ("UV") rays, or surface plasmon heat. Such a heat source may be attached to a chamber to increase the temperature in the chamber to a predetermined temperature.

The resulting product obtained after the heat treatment process may be subjected to a selected cooling process. The cooling process is performed so that the patterned graphene is grown and arranged uniformly. In one embodiment, for example, the resulting product may be cooled at a rate from about 10° C. to about 100° C., or may be cooled naturally. The natural cooling of the resulting product may be performed by stopping the operation of the heat source or removing the heat source from a reactor.

The number of layers formed of graphene may vary depending on the thickness of the SiC surface layer 3. In one embodiment, for example, when the thickness of the SiC surface layer 3 is about 0.75 nm, graphene having a thickness of one layer may be formed. Thus, when the thickness of the SiC surface layer is about 3 nm, graphene having a thickness of about four layers may be formed. The graphene may have a thickness of about one to about three hundred layers, for example, a thickness of about one to sixty layers, for example, a thickness of about one to fifteen layers, for example, a thickness of about one to ten layers.

In the heat treatment process, a gas-phase carbon source may be further added to accelerate the forming of graphene. The gas-phase carbon source may be carbon, and any material existing in a gas phase at a temperature of 300° C. or higher may be used as the gas-phase carbon source. The gas-phase carbon source may be any carbon-containing compound, and examples thereof include a compound with 6 carbon atoms or less, a compound with 4 carbon atoms or less, and a compound with 2 carbon atoms or less. In an embodiment, for example, the gas-phase carbon source may be at least one selected from the group consisting of carbon monoxide, methane, ethane, ethylene, methanol, ethanol, acetylene, propane, propylene, butane, butadiene, pentane, pentene, cyclopentadiene, hexane, cyclohexane, benzene and toluene. A solid carbon source such as polymethylmethacrylate may also be used.

The heat treatment process and the cooling process may be performed for one cycle. However, these processes may be repeatedly performed several times to generate high density multi-layered graphene. In one embodiment, for example, the heat treatment process may be repeatedly performed twice or three times to increase the crystallinity of the graphene.

The crystallinity of the graphene 6 that is directly grown on the SiC thin film 1 may be measured by Raman spectroscopy. Generally, in a Raman spectrum of graphene, a G peak exists in the vicinity of about 1580 inverse centimeters ($cm^{-1}$), and a D peak exists in the vicinity of about $1340 cm^{-1}$. The G peak is found in all the graphite-based materials, and a G mode or a G peak is named after the letter 'g' in graphite. The D peak is a crystal defect-induced peak, and is mainly observed around the edge of graphene or when a large number of defects are generated in the graphene. Thus, it may be interpreted that when the intensity of the D peak is high, a large number of defects exist in the graphene, which means that the crystallinity of the graphene is low. On the other hand, when the intensity of the D peak is low, there are few defects in the graphene, which means that the crystallinity of the graphene is high.

In Raman spectroscopy, the intensity of the D peak corresponds to a relative value, and thus may be defined as a relative ratio with respect to the intensity of the G peak. That is, when graphene is analyzed by Raman spectroscopy, the crystallinity of the graphene may be determined by a ratio of the intensity of the D peak to the intensity of the G peak.

For crystalline graphene obtained by the direct growth method described above, the ratio of the intensity of the D peak to the intensity of the G peak may be about 2:1 or less, for example, about 0.5:1 or less, for example, about 0.2:1 or less, for example, in the range of about 0.2:1 to about 0.001:1. When the D peak does not exist, that is, the crystallinity of the graphene is excellent, the ratio of the intensity of the D peak to the intensity of the G peak may be 0.

The term "graphene" as used herein refers to polycyclic aromatic molecule including a plurality of carbon atoms connected to each other by a covalent bond. The graphene may have the form of a sheet, and thus this "graphene" is different from cylinder-shaped carbon nanotubes. The plurality of carbon atoms may form a six-membered ring as a repeating unit, and may further include a 5-membered ring and/or a 7-membered ring. Thus, the graphene may include a single layer of covalently bonded carbon atoms having generally $sp^2$ hybridization. The graphene of the present invention may be formed as a single layer of graphene. A plurality of graphene layers is often referred to in the art as graphite. However, for convenience, "graphene" as used herein may include multiple layers of graphene stacked upon one another, and may have a maximum thickness of three hundred layers. Generally, the edges of the graphene are saturated with hydrogen atoms.

In a graphene-layered structure obtained by the direct growth method described above, graphene 6 is directly grown on the SiC thin film 1 and exists on an insulating layer, e.g., the ion implantation layer 4, and thus a transferring process is not required. Therefore, when the graphene-layered structure is applied to electronic devices, damage to the graphene may be minimized.

The transverse and longitudinal lengths of the graphene 6 may be 1 mm or greater, for example, 10 mm or greater, for example, in the range of about 10 mm to about 1,000 mm so that large-size graphene 6 is possible. That is, large-size graphene 6 may be obtained by freely adjusting the size of the SiC thin film 1.

The graphene-layered structure prepared as described above may be used in various applications. The graphene-layered structure has high conductivity and uniformity of film properties, and thus may be used as transparent electrodes. In solar cells, an electrode is formed on a substrate, and a transparent electrode should be used in terms of requirements for characteristics of the electrode, such as transmitting of light. When the graphene-layered structure is used as the transparent electrode, the electrode exhibits high conductivity. In addition, when the graphene-layered structure is used as a conductive thin film of a panel of any kind of display devices, the thin film may exhibit desired conductivity even when a small amount of the graphene-layered structure is used, and the amount of light being transmitted through the thin film may be increased.

Furthermore, the graphene-layered structure may be used in channels for memory devices, sensors or electronic paper. That is, graphene exists on the insulating layer in the graphene-layered structure, and thus the graphene-layered structure may be used as a gate electrode in various types of transistors such as field effect transistors ("FET").

Figure 2:
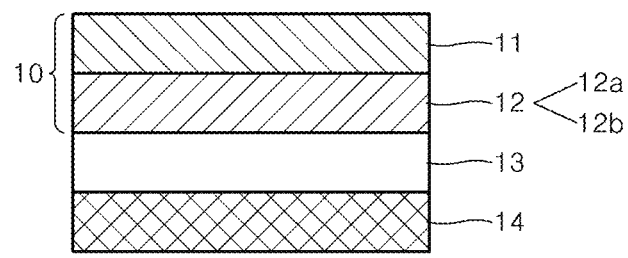
FIG. 2 is a diagram of a dye-sensitized solar cell including a graphene-layered structure, according to an embodiment.

As an example of a solar cell including the graphene-layered structure, a dye-sensitized solar cell is illustrated in FIG. 2. Referring to FIG. 2, the dye-sensitized solar cell includes a semiconductor electrode 10, an electrolyte layer 13 and a counter electrode 14. The semiconductor electrode 10 includes a conductive transparent substrate 11 and a light absorption layer 12. The light absorption layer 12 is formed by coating a colloidal solution of oxide nanoparticles 12a on a conductive glass substrate, heating the resulting structure in an electric furnace at a high temperature, and adsorbing dye 12b thereonto.

The conductive transparent substrate 11 may be a transparent electrode including the graphene-layered structure. The transparent electrode is obtained by directly growing graphene on a substrate by using the preparation method described above. This process may also be selectively applied to the counter electrode 14.

To prepare a dye-sensitized solar cell with a flexible structure, for example, a cylinder shape, both the transparent electrode and the counter electrode 14 may include a soft material.

The oxide nanoparticles 12a used in the dye-sensitized solar cell may be a n-type semiconductor, as semiconductor particles, where conduction electrons become carriers under excitation of light, thereby providing an anode current. In one embodiment, for example, the oxide nanoparticles 12a may include $TiO_2$ nanoparticles, $SnO_2$ nanoparticles, $ZnO_2$ nanoparticles, $WO_3$ nanoparticles, $Nb_2O_5$ nanoparticles, $Al_2O_3$ nanoparticles, MgO nanoparticles, or $TiSrO_3$ nanoparticles. In particular, the oxide nanoparticles 12a may be anatase-type $TiO_2$ nanoparticles. These oxide nanoparticles are not limited to the above examples, and may be used alone or in a combination of at least two of these oxide nanoparticles described above. Such semiconductor particles may have a relatively large surface area in order that the adsorbed dye absorbs a larger amount of light, and the diameter of the semiconductor particles may be about 20 nm or less to achieve this purpose.

The dye 12b may be any dye that is commonly used in solar cells or photovoltaic cells. In one embodiment, for example, the dye 12b may include a ruthenium complex. Examples of the ruthenium complex include complexes of the formulas $RuL_2(SCN)_2$, $RuL_2(H_2O)_2$, $RuL_3$, or $RuL_2$ wherein L is 2,2'-bipyridyl-4,4'-dicarboxylate. In addition, the dye 12b may be any dye having a charge separation capability and exhibiting sensitation, and examples of the dye 12b include xanthene-based pigments such as Rhodamine B, Rose Bengal, eosine, and erythrosine; cyanine-based pigments such as quinocyanine and cryptocyanine; basic dyes such as phenosafranine, cabri blue, thiosine, and methylene blue; porphyrin-based compounds such as chlorophyll, zinc porphyrin, and magnesium porphyrin; azo pigments; phthalocyanine compounds; complex compounds such as Ru trisbipyridyl; anthraquinone-based pigments, and polycyclic quinone-based pigments. These dyes may be used alone or in a combination of at least two of these dyes described above.

A total thickness of the light absorption layer 12 including the oxide nanoparticles 12a and the dye 12b may be about 15 µm or less, for example, from about 1 µm to about 15 µm. Such a light absorption layer has a high series resistance due to its structure, and an increase in the series resistance leads to a reduction in conversion efficiency. Thus, the thickness of the light absorption layer 12 may be adjusted to about 15 µm or less, whereby the function of the light absorption layer 12 is maintained and the series resistance thereof is maintained low, and the reduction in conversion efficiency may be prevented, accordingly.

The electrolyte layer 13 may include a liquid electrolyte, an ionic liquid electrolyte, an ionic gel electrolyte, a polymer electrolyte or combinations thereof. In one embodiment, for example, the electrolyte layer 13 may include an electrolyte. The electrolyte layer 13 may include the light absorption layer 12, or may be formed in such a manner that the electrolyte is infiltrated into the light absorption layer 12. In one embodiment, for example, the electrolyte may be an acetonitrile solution of iodine. The electrolyte is not limited to the above example, and may be any electrolyte having a hole conducting function.

The dye-sensitized solar cell may further include a catalyst layer. The catalyst layer is used to accelerate a redox reaction of the dye-sensitized solar cell, and may include platinum, carbon, graphite, carbon nanotubes, carbon black, a p-type semiconductor, and combinations thereof. The catalyst layer is disposed between the electrolyte layer 13 and the counter electrode 14. The catalyst layer may have a microstructure and a large surface area. In one embodiment, for example, the catalyst layer may include platinum black or porous carbon. The platinum black may be prepared by anodizing platinum or the treatment of chloroplatinic acid with platinum, and the porous carbon may be prepared by sintering carbon particles or plasticizing an organic polymer.

The dye-sensitized solar cell described above includes a transparent electrode including a highly-conductive flexible graphene-layered structure, and thus exhibits enhanced luminous efficiency and processability.

According to another embodiment of the present invention, a fuel cell includes the graphene-layered structure.

The fuel cell includes an anode, a cathode, and an electrolyte membrane interposed therebetween. In the anode, a hydrogen oxidation reaction ("HOR") occurs to generate hydrogen ions and electrons ($H_2 \rightarrow 2H^+ + 2e^-$), and the hydrogen ions ($H^+$) diffuse into the cathode through the electrolyte membrane and the electrons move through an external circuit. In the cathode, an oxidation-reduction reaction ("ORR") occurs to generate water ($2H^+ + 2e^- + \frac{1}{2}O_2 \rightarrow H_2O$). In this regard, the hydrogen ions ($H^+$) are supplied from the electrolyte membrane, and the electrons are supplied from the external circuit.

The fuel cell may be a phosphoric acid fuel cell ("PAFC"), a polymer electrolyte membrane fuel cell ("PEMFC"), or a direct methanol fuel cell ("DMFC"). An electrode catalyst for the fuel cell described above may be applied to a cathode of the fuel cell.

Figure 3:
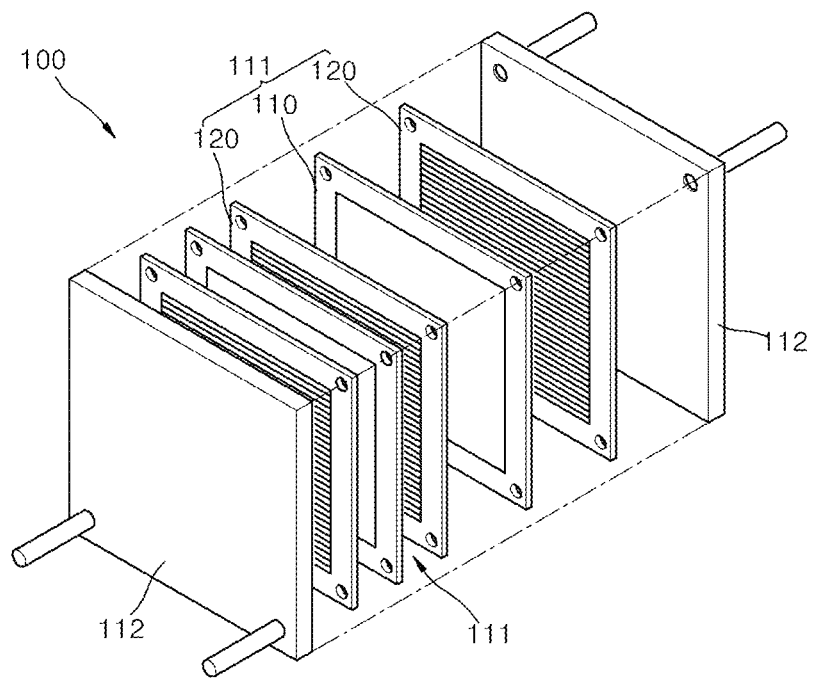
FIG. 3 is an exploded perspective view of a fuel cell according to an embodiment.
Figure 4:
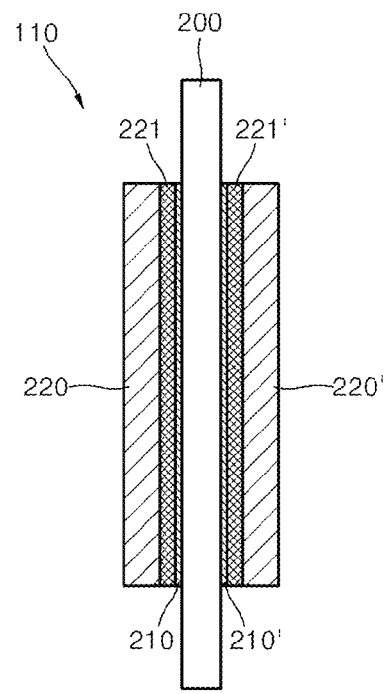
FIG. 4 is a cross-sectional view of a membrane-electrode assembly of a fuel cell according to an embodiment.

FIG. 3 is an exploded perspective view of a fuel cell 100 according to an embodiment, and FIG. 4 is a cross-sectional view of a membrane-electrode assembly ("MEA") 110 of the fuel cell of FIG. 3, according to an embodiment.

Referring to FIG. 3, the fuel cell 100 includes two unit cells 111 and a pair of holders 112, where the two unit cells 111 are included between the pair of holders 112. Each unit cell 111 includes a MEA 110, and bipolar plates 120 disposed on both of opposing sides of the MEA 110 in a thickness direction. The bipolar plates 120 may include a conductive metal or carbon, and are respectively attached to both of opposing surfaces of the MEA 110. The bipolar plates 120 function as a current collector, and supply oxygen and fuel to a catalyst layer of the MEA 110.

In FIG. 3, the number of unit cells 111 is two, but is not limited to the above example. That is, the number of unit cells 111 may be several tens to hundreds according to the required characteristics of the fuel cell 100.

Referring to FIG. 4, the MEA 110 includes an electrolyte membrane 200, catalyst layers 210 and 210' respectively disposed on both of opposing sides of the electrolyte membrane 200 in a thickness direction, first gas diffusion layers 221 and 221' respectively disposed on outer surfaces of the catalyst layers 210 and 210', and second gas diffusion layers 220 and 220' respectively disposed on outer surfaces of the first gas diffusion layers 221 and 221'. The electrolyte membrane 200 may include a polybenzimidazole electrolyte membrane, a polybenzoxazine-polybenzimidazole copolymer electrolyte membrane, or a polytetrafluoroethylene ("PTFE") porous membrane.

The catalyst layers 210 and 210' function as a fuel electrode and an oxygen electrode, and each catalyst layer includes a catalyst and a binder. The catalyst layers 210 and 210' may further include a material capable of increasing an electrochemical surface area of the catalyst. The catalyst may be platinum alone, or an alloy or mixture of platinum and at least one metal selected from the group consisting of gold, palladium, rhodium, iridium, ruthenium, tin, molybdenum, cobalt and chrome. Alternatively, the catalyst may be a supported catalyst in which these metal catalysts are supported on a carbonaceous carrier. The binder may be at least one selected from the group consisting of poly(vinylidenefluoride), polytetrafluoroethylene, a tetrafluoroethylene-hexafluoroethylene copolymer and perfluoroethylene. The amount of the binder may be in the range of about 0.001 part by weight to about 0.5 part by weight based on 1 part by weight of the catalyst. When the amount of the binder is within this range, wettability of the electrodes may be effectively enhanced.

Each of the first gas diffusion layers 221 and 221' and the second gas diffusion layers 220 and 220' may include a carbon sheet or carbon paper, and diffuses oxygen and fuel supplied through the bipolar plates 120 into an entire surface of each of the catalyst layers 210 and 210'.

The graphene-layered structure may be used in the first and second gas diffusion layers 221, 221', 220 and 220', the bipolar plates 120 or the catalyst layers 210 and 210'. The fuel cell 100 including the MEA 110 operates at a temperature ranging from about 100° C. to about 300° C. In the fuel cell 100, fuel, for example, hydrogen, is supplied to one of the catalyst layers 210 and 210' through the bipolar plate 120, and an oxidant, for example, oxygen, is supplied to the other thereof through the bipolar plate 120. In the one of the catalyst layers 210 and 210', hydrogen is oxidized to generate hydrogen ions ($H^+$), and the hydrogen ions ($H^+$) conduct the electrolyte membrane 200, thereby reaching the other of the catalyst layers 210 and 210'. In the other thereof, the hydrogen ions ($H^+$) and oxygen electrochemically react with each other to generate water ($H_2O$) and electrical energy. In addition, hydrogen supplied as fuel may be hydrogen carbide or hydrogen generated by modification of alcohol, and oxygen supplied as an oxidant may be oxygen included in air.

According to another embodiment of the present invention, there is provided a display device including a transparent electrode including the graphene-layered structure. Examples of the display device include an electronic paper display device, an organic light emitting display device, and a liquid crystal display ("LCD") device.

Among them, the organic light emitting display device is an active type light emitting display device in which when a current is applied to a fluorescent or phosphorescent organic compound thin film, electrons are combined with holes in an organic layer, thereby emitting light. Generally, the organic light emitting display device includes an anode, a hole transport layer ("HTL"), an emission layer ("EML"), an electron transport layer ("ETL") and a cathode, which are sequentially on a substrate. In order to easily inject electrons and holes, the organic light emitting display device may further include an electron injection layer ("EIL") and a hole injection layer ("HIL"). If desired, a hole blocking layer ("HBL") and a buffer layer may further be included. Since the anode may include a transparent material having high conductivity, a transparent electrode including the graphene-layered structure may efficiently be used as the anode.

The HTL may include a material that is commonly used to form a HTL, for example, polytriphenylamine; however, it is not limited to this example.

The ETL may include a material that is commonly used to form an ETL, for example, polyoxadiazole; however, it is not limited to this example.

The EML may include a commonly-used fluorescent or phosphorescent light emitting material, and further include at least one selected from the group consisting of at least one of a high-molecular weight host, a mixture of a high-molecular weight host and a low-molecular weight host, a low-molecular weight host and a non-luminous high-molecular weight matrix. The high-molecular weight host, the low-molecular weight host and the non-luminous high-molecular weight matrix may be any materials that are commonly used in an emission layer for an organic light emitting device. In one embodiment, for example, the high-molecular weight host may be, but is not limited to, poly(vinylcarbazole), polyfluorene, poly(p-phenylenevinylene), and polythiophene. Examples of the low-molecular weight host include, are not limited to, 4,4'-N,N'-dicarbazole-biphenyl ("CBP"), 4,4'-bis[9-(3,6-biphenylcarbazolyl)]-1-1,1'-biphenyl{4,4'-bis[9-(3,6-biphenylcarbazolyl)]-1-1,1'-biphenyl}, 9,10-bis[(2',7'-t-butyl)-9',9''-spirobifluorenyl anthracene tetrafluorene, or a combination thereof. Examples of the non-luminous high-molecular matrix include, but are not limited to, polymethylmethacrylate and polystyrene. The emission layer may be formed by vacuum deposition, sputtering, printing, coating or an inkjet process.

The manufacturing of the organic light emitting device described above does not require a certain device or method, and the organic light emitting device may be manufactured using the manufacturing processes of an organic light emitting device using general light emitting materials.

According to another embodiment of the present invention, there is provided an electric device including the graphene-layered structure. Examples of the electric device include a bipolar junction transistor ("BJT"), a FET, a heterojunction bipolar transistor ("HBT"), a single electron transistor, a light emitting diode ("LED") and an organic light emitting diode ("OLED"). In these devices, the graphene-layered structure may be used in a channel layer, electrodes or a buffer layer between an electrode and a channel layer.

Figure 5:
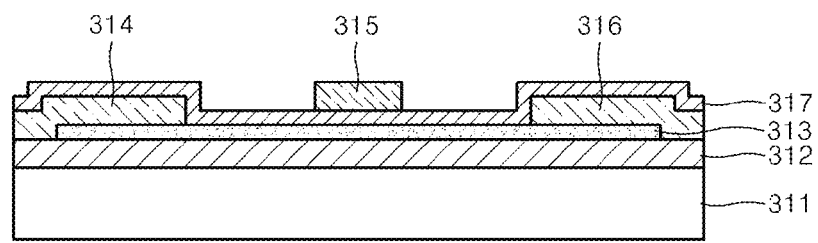
FIG. 5 is a cross-sectional view of a field effect transistor ("FET") according to an embodiment.
Figure 6:
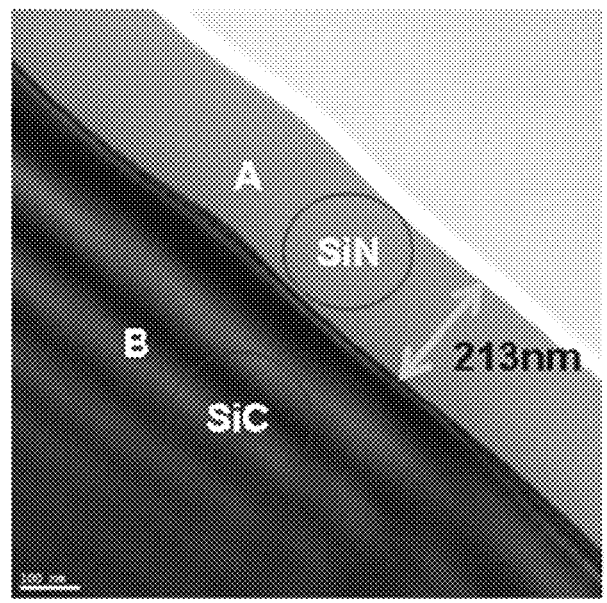
FIGS. 6 through 9 are transmission electron microscopic ("TEM") images each showing the inner cross-section of a silicon carbide (SiC) thin film formed after ion implantation, according to embodiment.

FIG. 5 is a cross-sectional view of a FET according to an embodiment. Referring to FIG. 5, a silica substrate 312 is disposed on a substrate 311, and a graphene-layered structure 313 is a channel layer on the silica substrate 312. A source electrode 314 and a drain electrode 316 are respectively disposed on both of opposing sides of the graphene-layered structure 313. A gate electrode 315 is disposed between the source electrode 314 and the drain electrode 316, and an insulating layer 317 is disposed between the gate electrode 315 and the source electrode 314 and between the gate electrode 315 and the drain electrode 316. In this regard, a voltage is applied to the gate electrode 315, thereby controlling a current flowing between the source and drain electrodes 314 and 316. That is, semiconductor layers (e.g., the graphene-layered structure 313 and the insulating layer 317) have a channel region, and a current flowing between the source and drain electrodes 314 and 316 is controlled by a voltage applied to the gate electrode 315, whereby the FET is switched on or off.

An interval between the source and drain electrodes 314 and 315 may be determined according to the use of the FET, and may be in the range of about 0.1 μm to about 1 mm, for example, in the range of about 1 μm to about 100 μm, for example, in the range of about 5 μm to about 100 μm.

The insulating layer 317 may include any material having electrical insulating properties and capable of being formed as a thin layer. In one embodiment, for example, a material having a resistivity of 10 ohm-centimeter (Ωcm) or greater at room temperature, such as a metal oxide (e.g., silicon oxide), a metal nitride (e.g., silicon nitride), a polymer, and an organic low molecule may be used. In one embodiment, for example, an inorganic oxide film having high specific inductive capacity may be used as the insulating layer 317.

The inorganic oxide may include silicon oxide, aluminum oxide, tantalum oxide, titanium oxide, tin oxide, vanadium oxide, barium strontium titanate, barium titanate zirconate, lead titanate zirconate, lead-lanthanaum titanate, strontium titanate, barium titanate, barium magnesium fluoride, lanthanum oxide, fluorine oxide, magnesium oxide, bismuth oxide, bismuth titanate, niobium oxide, strontium bismuth titanate, bismuth strontium tantalate, tantalum pentoxide, bismuth tantalate niobate, trioxide yttrium, or a combination thereof. In particular, the inorganic oxide may be silicon oxide, aluminum oxide, tantalum oxide, or titanium oxide.

Also, inorganic nitrides such as silicon nitride ($Si_xN_y$, where x, y>0, for example, $Si_3N_4$) and aluminum nitride may be suitably used.

Furthermore, the insulating layer 317 may include a precursor substance containing a metal alkoxide. A solution of the precursor substance is applied on a substrate, followed by wet chemical treatment including heat treatment to form an insulating layer, for example.

The metal of the metal alkoxide may include, for example, a metal selected from the group consisting of transition metals, lanthanides and main-group elements. Specific examples include barium (Ba), strontium (Sr), titanium (Ti), bismuth (Bi), tantalum (Ta), zirconium (Zr), iron (Fe), nickel (Ni), manganese (Mn), lead (Pb), lanthanum (La), lithium (Li), sodium (Na), potassium (K), rubidium (Rb), cesium (Cs), francium (Fr), beryllium (Be), magnesium (Mg), calcium (Ca), niobium (Nb), thallium (Tl), mercury (Hg), copper (Cu), cobalt (Co), rhodium (Rh), scandium (Sc), yttrium (Y), or a combination thereof. The alkoxide of the metal alkoxide may be derived from an alcohol, including methanol, ethanol, propanol, iso-propanol, butanol, iso-butanol, alkoxy alcohols including methoxy ethanol, ethoxy ethanol, propoxy ethanol, butoxy ethanol, pentoxy ethanol, heptoxy ethanol, methoxy propanol, ethoxy propanol, propoxy propanol, butoxy propanol, pentoxy propanol, heptoxy propanol, or a combination thereof.

When the insulating layer 317 includes the above-mentioned materials, polarization occurs easily in the insulating layer 317 so that the threshold voltage of the transistor operation can be reduced. Among the above-mentioned materials, when the insulating layer 317 includes silicon nitride such as $Si_xN_y$ where x, y>0, for example, $Si_3N_4$, or $SiON_x$ where x>0, a depletion layer is generated more easily so that the threshold voltage of the transistor operation may be further reduced.

The insulating layer 317 may include an organic compound such as polyimide, polyamide, polyester, or polyacrylate, or a product of a photo-curable resin such as photo-radical polymerization systems and photo-cation polymerization systems, or a copolymer containing an acrylonitrile component, or polyvinylphenol, polyvinylalcohol, novolak resins or cyanoethyl pullulan.

In addition, polymeric materials having a high dielectric constant, such as wax, polyethylene, polychloropyrene, polyethylene terephthalate ("PET"), polyoxymethylene, polyvinyl chloride, poly(vinylidene fluoride), polysulfone, polycarbonate ("PC"), polyimidocyanoethylpullulan, poly(vinylphenol) ("PVP"), poly(methylmethacrylate) ("PMMA"), polystyrene ("PS"), polyolefin, polyacrylamide, poly(acrylic acid), novolak resin, resole resin, polyimide, polyxylylene, epoxy resin, pullulan, or a combination thereof, may be used.

The insulating layer 317 may be a layer in which a plurality of the above-described inorganic or organic compound materials are mixed or may have a stacked layer structure thereof. In this case, the device performance may be controlled by mixing or stacking a material having a high dielectric constant and a material having water repellency, if necessary.

Methods of forming the insulating layer 317 include dry processes such as vacuum vapor deposition, molecular beam epitaxy, an ion cluster beam technique, low-energy ion beam technology, ion plating, a chemical vapor deposition ("CVD") method, sputtering, and atmospheric pressure plasma, and wet processes, for example, application methods such as spray coating, spin coating, blade coating, dip coating, casting, roll coating, bar-coating and die coating, and patterning methods such as printing and an inkjet process. These methods may be used depending upon the kind of the material used. As the wet process, a method of application and drying a liquid in which inorganic oxide fine particles are dispersed in any organic solvent or water, if necessary, by using a dispersing aid such as a detergent, and a so-called sol-gel process wherein a solution of an oxide precursor such as an alkoxide form is applied and dried, may be used.

At least one of a metal atom layer and a metal ion layer may further be between the graphene-layered structure 313 and the insulating layer 317. The metal atom layer may include Zn, Al, Ga, Zr, Ni, Co, Pd, or a combination thereof. The metal ion layer may include ions of Zn, Al, Ga, Zr, Ni, Co, Pd, or a combination thereof, and these metal ions may be in the form of a metal salt. A counter anion of the metal salt may be halogen, $(COON)^{-1}$, $NO_3^{2-}$, $SO_4^{2-}CO_3^{2-}$, or combination thereof. The metal atom layer or the metal ion layer may have a thickness of one layer to three layers of a metal atom or metal ion.

The metal atom layer or the metal ion layer may be formed using a well-known method in the art. Examples of methods for forming the metal atom layer or the metal ion layer may include, are not limited to, dry processes such as vacuum vapor deposition, molecular beam epitaxy, an ion cluster beam technique, low-energy ion beam technology, ion plating, a CVD method, sputtering, and atmospheric pressure plasma; and wet processes, for example, application methods such as spray coating, spin coating, blade coating, dip coating, casting, roll coating, bar-coating and die coating, and patterning methods such as printing and an inkjet process. These methods may be used depending upon the kind of the material used.

The substrate of the FET, for example, a thin film transistor ("TFT") supports the structure of the TFT, and may be a glass substrate, a substrate including an inorganic compound such as metal oxide or metal nitride, a plastic film (e.g., PET, polyethylene succinate ("PES"), or PC), a metal substrate, or a combination or laminate thereof. In addition, when the structure of the TFT is fully supported by other elements except for the substrate, the substrate may not be used. The substrate may also be a silicon (Si) wafer. In this case, Si itself may be used as the substrate as well as a gate electrode. In addition, a surface of Si is oxidized to form $SiO_2$, so that it may be used as an insulating layer. In this case, a layer of metal such as Au may be formed, as an electrode for lead connections, on the Si substrate used as a substrate as well as a gate electrode.

In a transistor according to an embodiment, a gate electrode, a source electrode, and a drain electrode may include any conductive material. Examples of the conductive material include platinum, gold, silver, nickel, chromium, copper, iron, tin, antimonial lead, tantalum, indium, palladium, tellurium, rhenium, iridium, aluminum, ruthenium, germanium, molybdenum, tungsten, tin-antimony oxide, indium-tin oxide ("ITO"), fluorine-doped zinc oxide, zinc, carbon, graphite, glassy carbon, silver paste, carbon paste, lithium, beryllium, sodium, magnesium, potassium, calcium, scandium, titanium, manganese, zirconium, gallium, niobium, a sodium-potassium alloy, a magnesium/copper mixture, a magnesium/silver mixture, a magnesium/aluminum mixture, a magnesium/indium mixture, an aluminum/aluminum oxide combination, a lithium/aluminum combination, or a combination thereof. When these materials are used, an electrode may be formed by sputtering or vacuum deposition.

In an embodiment, the source electrode and the drain electrode may include a fluidic electrode material such as a solution, paste, ink or dispersion including the conductive material described above. In one embodiment, for example, a well-known conductive paste may be used as a dispersion including metal fine particles, and any dispersion including metal fine particles each having a particle diameter in the range of about 0.5 nm to about 50 nm, for example, in the range of about 1 nm to about 10 nm, may be used. Examples of the metal fine particles include particles of platinum, gold, silver, nickel, chromium, copper, iron, tin, antimonial lead, tantalum, indium, palladium, tellurium, rhenium, iridium, aluminum, ruthenium, germanium, molybdenum, tungsten, zinc, or a combination thereof.

An electrode may be formed using a dispersion in which these metal fine particles are dispersed in a dispersion medium such as water or an organic solvent, by using a dispersion stabilizer composed mainly of an organic material. A method of preparing such a dispersion of metal fine particles includes physical production methods such as a gas evaporation technique, sputtering and a metal vapor synthesis technique, and chemical production methods such as a colloid method and a coprecipitation method wherein metal ions are reduced in a liquid phase to generate metal fine particles.

The electrode is formed using the dispersion of these metal fine particles, a solvent is dried, and the resulting product is heated at a temperature in the range of about 100° C. to about 300° C., for example, in the range of about 150° C. to about 200° C., if necessary, thereby thermally fusing the metal fine particles. As a result, an electrode pattern having a desired shape may be formed.

In addition, known conductive polymers having enhanced conductivity by doping may be used as the materials for the gate electrode, the source electrode and the drain electrode. In one embodiment, for example, conductive polyanilines, conductive polypyrroles, conductive polythiophenes (complexes of polyethylenedioxythiophene and polystyrenesulfonic acid) may be used. By these materials, contact resistance of the source electrode and the drain electrode with a semiconductor layer may be reduced.

The materials of the source electrode and the drain electrode as described above may be any materials having small electric resistance at the contact surface with the semiconductor layer. This electric resistance corresponds to the field effect mobility of an electric current control device to be formed. To obtain a larger mobility, it is necessary to decrease the resistance as much as possible.

The electrode may be formed by deposition, electron beam deposition, sputtering, an atmospheric pressure plasma process, ion plating, CVD, electrodeposition, electroless plating, spin coating, printing or an inkjet process. In addition, if necessary, the electrode may be formed using a patterning process. In one embodiment, for example, the conductive thin film formed by the above-mentioned method is subjected to known photolithography or a lift-off method to form an electrode, or a resist film is formed on a metal foil such as aluminum or copper by thermal transfer, an inkjet process or the like, and etching is then performed thereon to form an electrode. In addition, a patterning process may be directly performed using a solution or dispersion of conductive polymers or a dispersion containing metal fine particles by an inkjet process, or the electrode may be formed from a coating film by lithography or laser ablation. Furthermore, a patterning process of the electrode may be performed using a conductive ink or paste containing conductive polymers or metal fine particles by letterpress printing, intaglio printing, surface printing or screen printing.

The thickness of the electrode formed as above is not particularly limited as long as electric current flows; however, it may be in the range of about 0.2 nm to about 10 µm, for example, in the range of about 4 nm to about 300 nm. When the thickness of the electrode is within this range, a voltage drop may not occur due to high resistance because of the small film thickness.

In the transistor according to an embodiment, for example, for the purpose of increasing the injection efficiency, a buffer layer may be between the semiconductor layer and the source electrode and between the semiconductor layer and the drain electrode. For an n-type TFT, the buffer layer may include a compound having an ionic bond with an alkali metal or an alkaline earth metal such as LiF, $Li_2O$, CsF, $Na_2CO_3$, KCl, $MgF_2$ or $CaCO_3$, which is used for the cathode in an organic electroluminescent ("EL") device. In addition, compounds used for the EIL and ETL in an organic EL device, such as $Alq_3$ a tris(8-quinolinol)aluminum complex ("$Alq_3$") may be inserted.

The buffer layer has an effect to reduce the threshold voltage by decreasing the injection barrier of carriers, and to drive the transistor with a low voltage. The buffer layer may be provided between the electrode and the semiconductor layer with a relatively small thickness, and the thickness thereof may be in the range of about 0.1 nm to about 30 nm, for example, in the range of about 0.3 nm to about 20 nm.

In addition, an OLED is electrically connected to the TFT, and is then controlled using a current flowing between the source and drain electrodes. Thus, a flat panel display device including such a structure may be manufactured.

One or more embodiments of the present invention will now be described in more detail with reference to the following examples. However, these examples are not intended to limit the scope of the one or more embodiments of the present invention.

Example 1

Nitrogen-doped n-type 6H—SiC having a size of 0.3 cm×1.6 cm and a thickness of 300 µm was placed in a chamber with the Si-face upward, and nitrogen ion implantation was performed thereon by using an ion implantation device. The amount of implanted nitrogen ions was $3×10^{17}$ ions/$cm^2$, and the implantation energy thereof was 75 keV. The temperature of the SiC substrate was maintained at 650° C. Through such an ion implantation method, a SiN layer having a thickness of 213 nm was formed at an interval of from about 2 nm to about 3 nm from a surface of the SiC substrate into which nitrogen ions were implanted.

Figure 7:
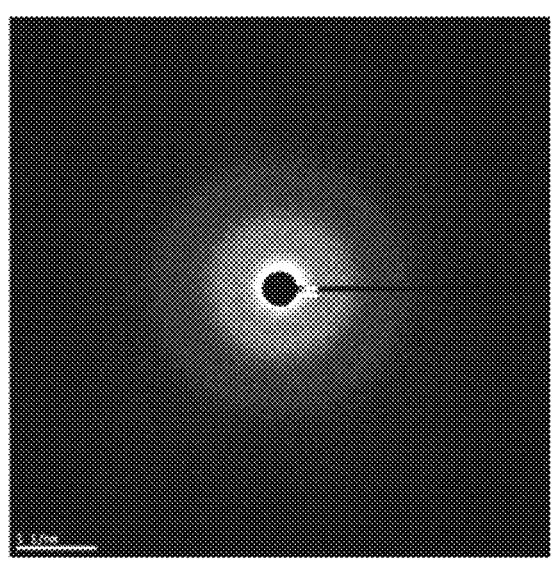
Figure 8:
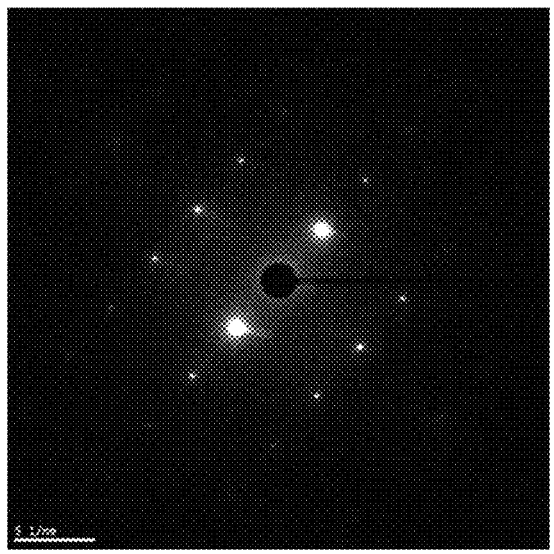

FIGS. 6 through 9 are transmission electron microscopic ("TEM") images each showing the inner cross-section of a SiC thin film formed after the ion implantation. Referring to the images, it is seen that the SiN layer formed by the ion implantation is formed to a thickness of 213 nm in the SiC thin film. FIG. 7 illustrates a TEM electron diffraction pattern of a SiN region represented as A in FIG. 6, and, referring to FIG. 7, it is seen that a non-amorphous insulating layer was formed. FIG. 8 illustrates a TEM electron diffraction pattern of a SiC region represented as B in FIG. 6, and it is seen that a general crystalline silicon carbon exists.

Figure 9:
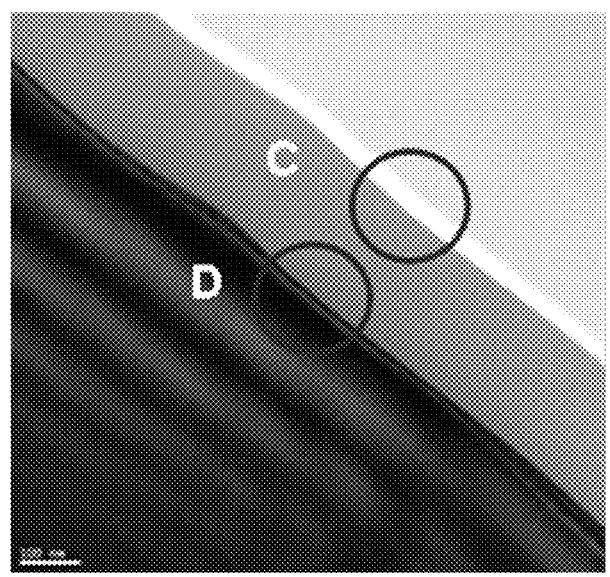
Figure 10:
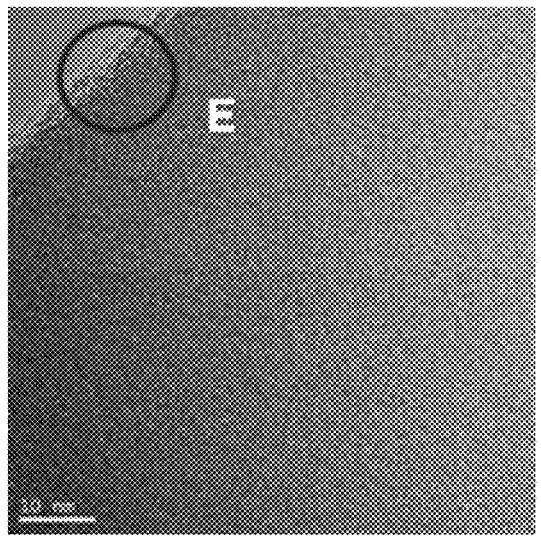
FIG. 10 is an enlarged view of region C of FIG. 9, according to an embodiment.
Figure 12:
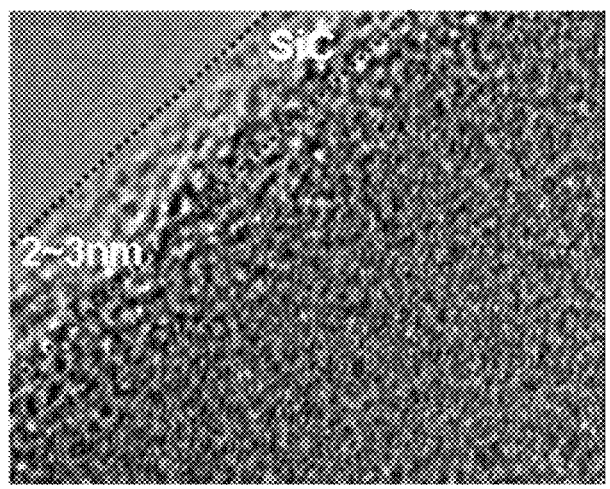
FIG. 12 is an enlarged view of region E of FIG. 10, according to an embodiment.

FIG. 10 is an enlarged view of region C of FIG. 9 (which is essentially the same image as FIG. 6), and it is confirmed that the SiC surface layer exists on the SiN layer. FIG. 12 is an enlarged view of a region E of FIG. 10. Referring to FIG. 12, a SiC surface layer has a thickness in the range of about 2 to about 3 nm.

Figure 11:
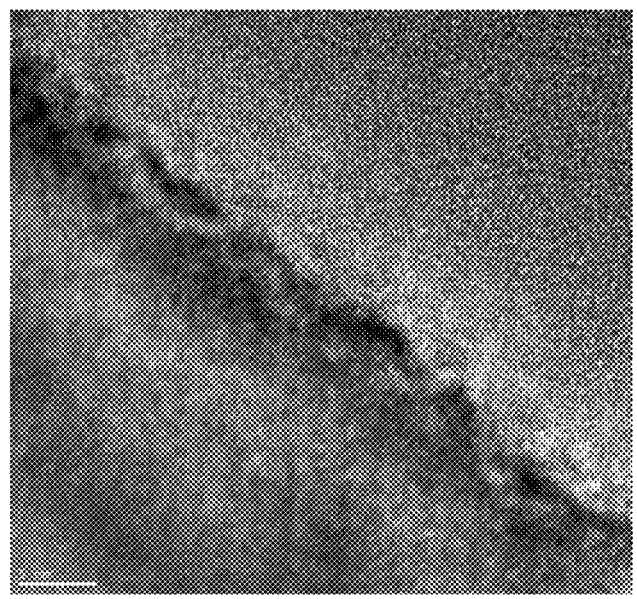
FIG. 11 is an enlarged view of region D of FIG. 9, according to an embodiment.

FIG. 11 is an enlarged view of region D of FIG. 9, and illustrates an interface between the SiN layer and the SiC thin film.

Figure 13:
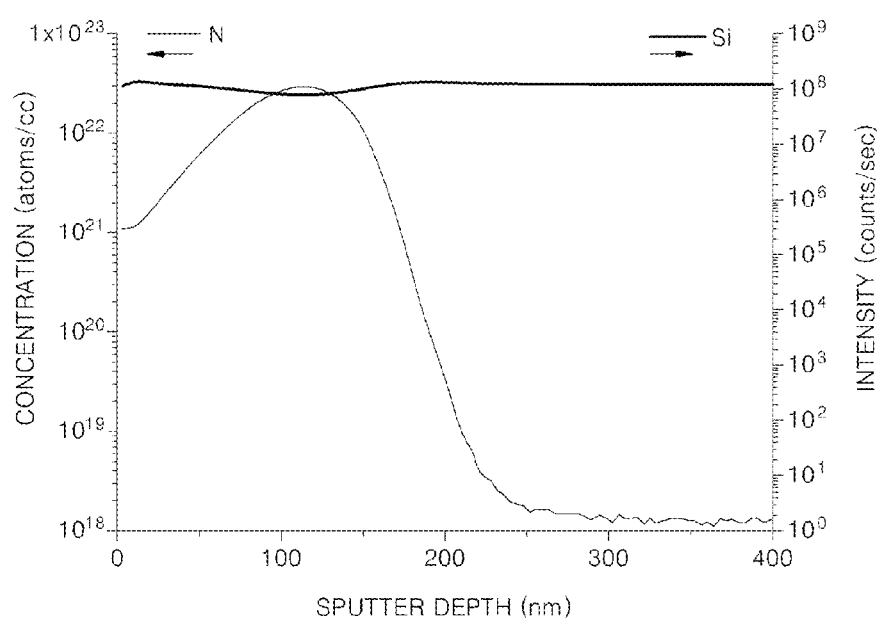
FIG. 13 is a graph showing dynamic secondary ion mass spectrometry ("SIMS") results of a SiC thin film formed after an ion implantation process, according to an embodiment.
Figure 14:
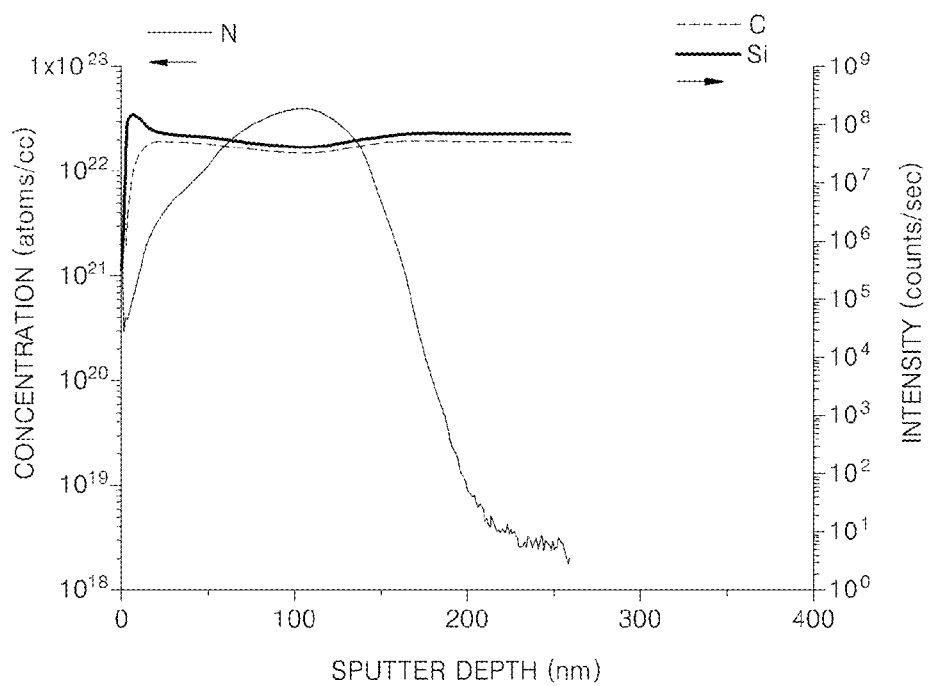
FIG. 14 is a graph showing dynamic SIMS results of graphene formed by a heat treatment process, according to an embodiment.

After the ion implantation process described above was performed, a heat treatment process (induction heating) was performed on the resulting product under a vacuum of $1×10^{-12}$ Torr for 270 seconds at 1,330° C. to form graphene with an epitaxial structure on the SiN layer by using the SiC surface layer. The formed graphene has a thickness of about three layers to about four layers. FIG. 13 is a graph showing dynamic secondary ion mass spectrometry ("SIMS") results of the SiC thin film formed after the ion implantation process, and it is confirmed that nitrogen ions were implanted into the initial SiC thin film. FIG. 14 is a graph showing dynamic SIMS results of the graphene formed by the heat treatment process, and it is seen that graphene was formed. FIG. 13 and FIG. 14 illustrate concentration in atoms per cubic centimeter (atoms/cc) and intensity in counts per second (counts/sec) versus sputter depth in nm.

Figure 15:
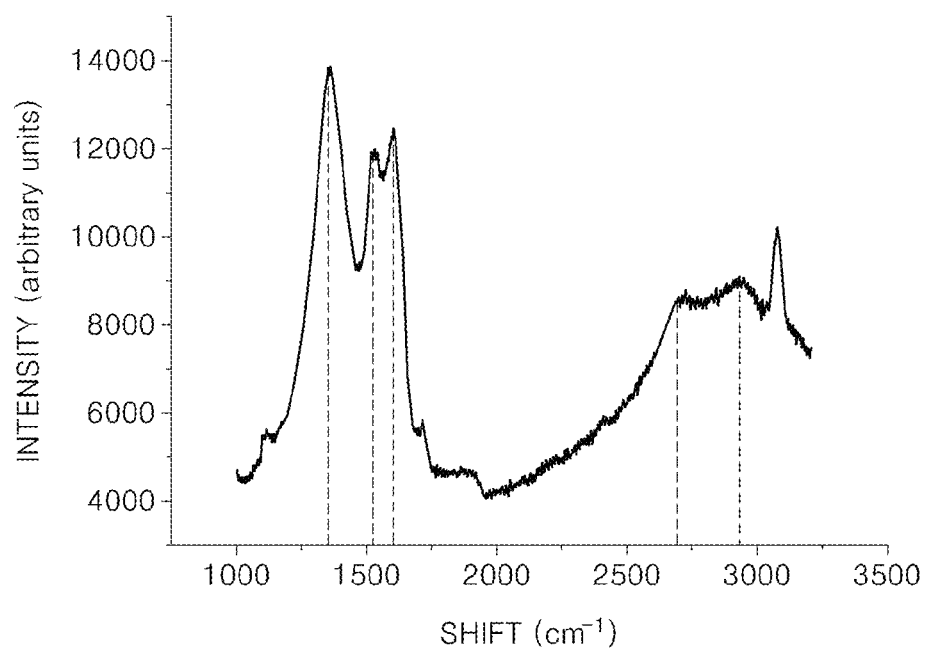
FIG. 15 is a graph showing Raman spectrum results of graphene, according to an embodiment.

FIG. 15 is a graph showing Raman spectrum results of the graphene. Referring to FIG. 15, a 2D peak exists in the vicinity of 2,700 cm$^{-1}$. From this result, it is seen that graphene is formed. FIG. 15 illustrates intensity in arbitrary units versus Raman shift in cm$^{-1}$.

Example 2

Graphene was formed in the same manner as in Example 1, except that the heat treatment process was performed for 600 seconds instead of 270 seconds.

Figure 16:
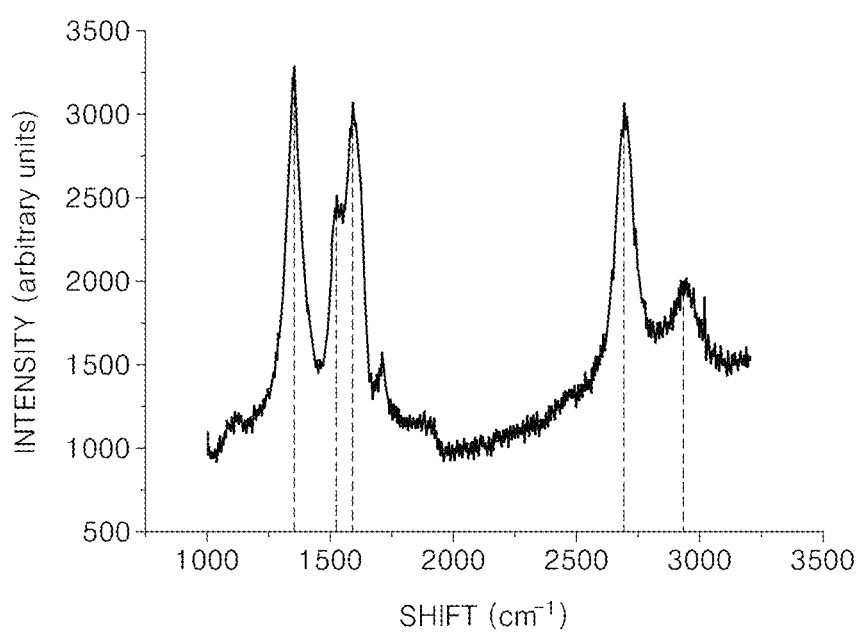
FIG. 16 is a graph showing Raman spectrum results of formed graphene, according to an embodiment.

FIG. 16 is a graph showing Raman spectrum results of the formed graphene. Comparing the results illustrated in FIG. 16 with the results illustrated in FIG. 15, a 2D peak existing around 2700 cm$^{-1}$, which indicates the presence of the graphene, is more distinct. FIG. 16 illustrates intensity in arbitrary units versus Raman shift in cm$^{-1}$.

As described above, according to the one or more of the above embodiments of the present invention, in a method of preparing a graphene-layered structure, graphene is directly grown on an insulating layer, and thus a separate transferring process is not required when the graphene-layered structure is applied to a device. Accordingly, damage to graphene that may occur in the transferring process may be reduced or effectively prevented. The graphene-layered structure prepared as above including the insulating layer may be used in various electric devices such as transistors.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A graphene-layered structure comprising:
an ion implantation layer in a silicon carbide thin film; and
a graphenized silicon carbide surface layer on the ion implantation layer,
wherein
the ion implantation layer is in contact with a Si-face surface of the silicon carbide thin film by ion-implanting nitrogen ions into a Si-face surface of the silicon carbide thin film,
the ion implantation layer comprises at least one of silicon nitride or silicon carbon nitride,
the ion implantation layer has a nitrogen concentration and the nitrogen concentration in the ion implantation layer varies according to a depth of the ion implantation layer, and
the graphenized silicon carbide surface layer is on the ion implantation layer by heat treating the silicon carbide thin film with the ion implantation layer therein.

2. A graphene-layered structure comprising:
graphene;
a silicon nitride layer below the graphene; and
a silicon carbide layer below the silicon nitride layer,
wherein the silicon nitride layer has a nitrogen concentration and the nitrogen concentration in the silicon nitride layer varies according to a depth of the silicon nitride layer, and
the silicon nitride layer is in contact with a Si-face surface of the silicon carbide layer.

3. A transistor comprising the graphene-layered structure of claim 2.

4. A transparent electrode comprising the graphene-layered structure of claim 2.

5. The graphene-layered structure of claim 2, wherein the silicon nitride layer is directly on the silicon carbide layer and the graphene is directly on the silicon nitride layer.

6. The graphene-layered structure of claim 5, wherein the silicon nitride layer is directly on the silicon carbide layer by ion-implanting at least one ion of a nitrogen ion and an oxygen ion on a surface of a silicon carbide thin film, and
the graphene is directly on the silicon nitride layer by heat treating the silicon carbide thin film including with the silicon nitride layer thereon.

* * * * *